US008653896B2

United States Patent
Takagi et al.

(10) Patent No.: US 8,653,896 B2
(45) Date of Patent: Feb. 18, 2014

(54) CLASS-AB POWER AMPLIFIER

(75) Inventors: Kazutaka Takagi, Kawasaki (JP); Naotaka Tomita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/267,138

(22) Filed: Oct. 6, 2011

(65) Prior Publication Data
US 2012/0218046 A1 Aug. 30, 2012

(30) Foreign Application Priority Data
Feb. 28, 2011 (JP) ................. 2011-042668

(51) Int. Cl.
*H03F 3/14* (2006.01)
(52) U.S. Cl.
USPC ........................................... 330/307; 330/302
(58) Field of Classification Search
USPC ................ 330/302, 286, 53, 277, 307, 57
See application file for complete search history.

(56) References Cited

U.S. PATENT DOCUMENTS

| 7,741,907 B2 | 6/2010 | Takagi |
| 2012/0105147 A1* | 5/2012 | Harris et al. ................. 330/57 |

FOREIGN PATENT DOCUMENTS

| JP | 2000-106510 A | 4/2000 |
| JP | 2008-504745 A | 2/2008 |
| JP | 2008-263438 A | 10/2008 |
| JP | 2009-94805 | 4/2009 |
| JP | 2011-35761 A | 2/2011 |
| JP | 2012-518373 A | 8/2012 |
| WO | WO 2011/007529 A1 | 1/2011 |

OTHER PUBLICATIONS

Peter Wright, et al., "A Methodology for Realizing High Efficiency Class-J in a Linear and Broadband PA", IEEE Transactions on Microwave Theory and Techniques, vol. 57, No. 12, Dec. 2009, 9 Pages.
Steve C. Cripps, et al., "New PA Modes for a New PA Technology", IEEEMTT-S Workshop (WSF), Jul. 2010, 20 Pages.
Office Action issued Dec. 4, 2012 in Japanese Patent Application No. 2011-042668 (with English-language translation).
U.S. Appl. No. 13/728,167, filed Dec. 27, 2012, Takagi.

* cited by examiner

*Primary Examiner* — Hieu Nguyen
(74) *Attorney, Agent, or Firm* — Oblon, Spivak, McClelland, Maier & Neustadt, L.L.P.

(57) ABSTRACT

A class-AB power amplifier according to the present embodiment includes an amplifying element whose power supply voltage is expressed as Vdc and whose maximum current is expressed as Imax, a conduction angle θo of the amplifying element being more than π(rad) and less than 2·π(rad), and load impedance of a fundamental wave being expressed as Z1=R1+j·X1, load impedance of a 2nd harmonic being expressed as Z2=R2+j·X2, and load impedance of a 3rd harmonic being expressed as Z3=R3+j−X3 which are observed from a dependent current source of an equivalent circuit of the amplifying element, and a relationship between variables X1 and R1 is set to −0.5·R1<=X1<=0.5·R1, variable R1 is set to R1=Vdc/Imax·{1−cos(θo/2)}·π/{θo/2−sin(θo)/2}, variable X2/X1 is set to X2/X1=−2·{θo−sin(θo)}/{sin(θo/2)−sin (1.5·θo)/3}, and variable X3/X1 is set to X3/X1={θo−sin(θo)}/{sin(θo)/3−sin(2·θo)/6}, or each of the variables is set thereto so as to become equal substantially.

10 Claims, 10 Drawing Sheets

US 8,653,896 B2

CLASS-AB POWER AMPLIFIER

CROSS REFERENCE TO RELATED APPLICATIONS

This application is based upon and claims the benefit of priority from prior Japanese Patent Application No. P2011-042668 filed on Feb. 28, 2011, the entire contents of which are incorporated herein by reference.

FIELD

Embodiment described herein generally relate to a class-AB power amplifier.

BACKGROUND

Conventionally, a power amplifier for communication applications of which high linearity is required has been composed using a class-A power amplifier. However, along with progress in a linearizer in recent year, an instance of a power amplifier for communication applications composed of a highly efficient class-B power amplifier has increased, although linearity of the class-B power amplifier is poorer than that of a class-A power amplifier.

However, since a gain at the time of a small signal decreases due to the nonlinear characteristics of the amplifying element, or it becomes a class-C operation due to a temperature variation, etc., a distortion is increased, thereby lacking in distortion compensation factors of the linearizer. Therefore, a class-AB power amplifier in the middle between the class-A power amplifier and the class-B power amplifier is often used in actuality.

If load impedance matching only of a fundamental wave is performed, a class-A operation will get close to 50% of theoretical efficiency. However, in order to improve the efficiency of a class-AB operation, load impedance for higher order harmonics must be made to short-circuit based on theory. Therefore, in the class-AB operation, the degree of difficulty in achieving broader bandwidths is great.

On the other hand, also in the class-B operation, since load impedance for higher order harmonics has to be made to short-circuit based on theory in order to get close to 78.5% of the theoretical efficiency, the degree of difficulty in achieving the broader bandwidths was great.

On the other hand, a class-J3 operation received attention recently can achieve the same efficiency as the class-B operation over the broader bandwidths.

Although the class-B power amplifier can achieve the broader bandwidths, linearity of the class-B power amplifier is poorer than that of the class-AB power amplifier. Although the linearity of the class-AB power amplifier is better efficiency than that of the class-B power amplifier, the bandwidth of the class-AB power amplifier is narrower than that of the class-B power amplifier.

DETAILED DESCRIPTION

Hereinafter, embodiments will be described with reference to drawings.

A class-AB power amplifier according to the present embodiment comprises an amplifying element whose power supply voltage is expressed as Vdc and whose maximum current is expressed as Imax, a conduction angle θo of the amplifying element being more than $\pi$(rad) and less than $2\cdot\pi$(rad), and load impedance of a fundamental wave being expressed as $Z1=R1+j\cdot X1$, load impedance of a 2nd harmonic being expressed as $Z2=R2+j\cdot X2$, and load impedance of a 3rd harmonic being expressed as $Z3=R3+j-X3$ which are observed from a dependent current source of an equivalent circuit of the amplifying element, wherein a relationship between variables X1 and R1 is set to $-0.5\cdot R1<=X1<=0.5\cdot R1$, variable R1 is set to $R1=Vdc/Imax\cdot\{1-\cos(\theta o/2)\}\cdot\pi/\{\theta o/2-\sin(\theta o)/2\}$, variable X2/X1 is set to $X2/X1=2\cdot\{\theta o-\sin(\theta o)\}/\{\sin(\theta o/2)-\sin(1.5\cdot\theta o)/3\}$, and variable X3/X1 is set to $X3/X1=\{\theta o-\sin(\theta o)\}/\{\sin(\theta o)/3-\sin(2\cdot\theta o)/6\}$, or each of the variables is set thereto so as to become equal substantially.

Figure 1:
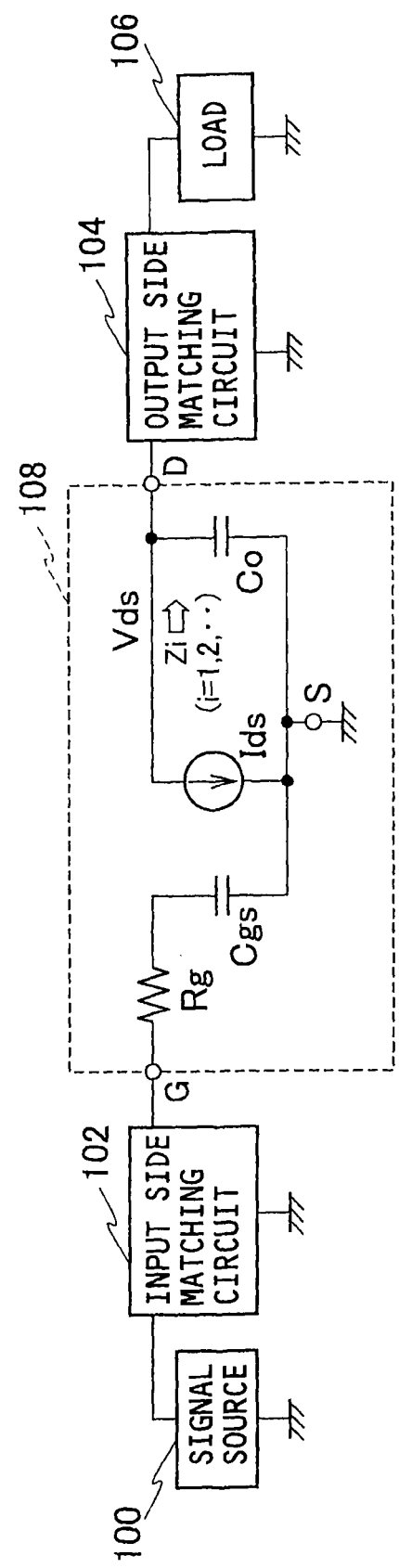
FIG. 1 is a diagram showing an example of an equivalent circuit simplified by omitting a bias circuit etc., in a class-AB power amplifier according to an embodiment.

In the class-AB power amplifier according to the embodiment, an example of an equivalent circuit simplified by omitting a bias circuit etc. is expressed as shown in FIG. 1.

Although not only a semiconductor but also a vacuum tube etc. may be sufficient as the amplifying element, it will explain a source common Field Effect Transistor (FET) 108 as the amplifying element, hereinafter.

As shown in FIG. 1, the equivalent circuit of the class-AB power amplifier according to the embodiment includes: a gate resistance Rg and a capacitor Cgs between gate and source configured to be connected in series between a gate terminal electrode G and a source terminal electrodes S; a current source Ids and an output capacitance Co configured to be connected in parallel between the drain terminal electrode D and the source terminal electrode S; an input side matching circuit 102 configured to be connected to the gate terminal electrode G; and an output side matching circuit 104 configured to be connected to the drain terminal electrode D.

Furthermore, a signal source 100 is connected to the input side matching circuit 102, and a load 106 is connected to the output side matching circuit 104.

A circuit configuration of an equivalent circuit of a class-B operation according to a comparative example is also the same as that of the equivalent circuit of the class-AB power amplifier according to the embodiment shown in FIG. 1. A difference between the class-AB operation and the class-B operation is a difference in both conduction angles. The difference in the both conduction angles is caused by a difference in both gate biases.

According to a theory of the class-B operation whose conduction angle is $\theta o=\pi$(rad), maximum electric output power $Po=Vdc\cdot Imax/4$ in linearity are obtained, where power supply voltage of DC component of voltage Vds between drain and source is expressed as Vdc, the maximum current of current Ids of a dependent current source is expressed as Imax, load impedance of a fundamental wave observed from the dependent current source is expressed by the following equation, $Z1=R1+j\cdot X1=2\cdot Vdc/Imax$, and load impedance for higher order harmonics is expressed by the following equation, $Zi=Ri+j\cdot Xi=0$ (where $i=2, 3, \ldots$), At this time, the electronic power supply current of the DC component of the current Ids is expressed by the following equation, $Idc=Imax/\pi$, power consumption is expressed as $Pdc=Vdc\cdot Imax/\pi$, and drain efficiency (abbreviated as efficiency, hereinafter) is expressed by the following equation, $\eta d=Po/Pdc=\pi/4=78.5\%$.

Figure 2:
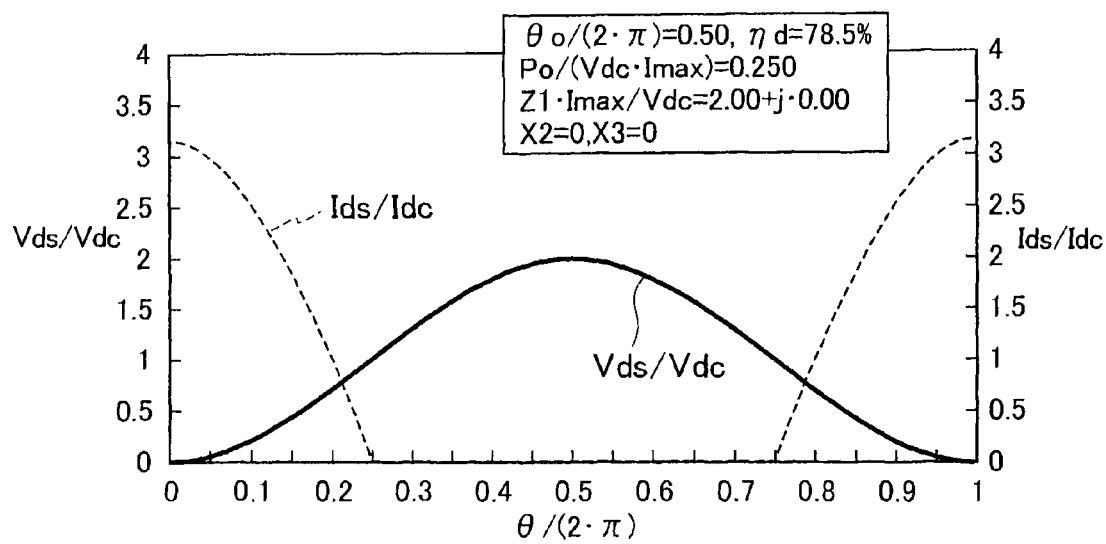
FIG. 2 is a diagram showing an example of waveforms of Vds/Vdc and Ids/Idc, in a class-B operation according to a comparative example.

An example of waveforms of Vds/Vdc and Ids/Idc of the class-B operation according to the comparative example is expressed as shown in FIG. 2. That is, as shown in FIG. 2, in waveforms where a horizontal axis indicates phase $\theta/(2\cdot\pi)$ standardized in one cycle, and a vertical axis indicates Ids/Idc of Ids standardized by Idc and Vds/Vdc of Vds standardized by Vdc, Ids contains no odd-number order harmonics component, and a 2nd harmonic component I2 is $I2/I1=0.42$ and a 3rd harmonic component I3 is $I3/I1=0$ for a fundamental wave component I1 of Ids. Furthermore, Vds contains no harmonic component.

However, in an actual output side matching circuit, even if not less than a 4th harmonic is ignored, equations $Z1=2\cdot Vdc/Imax$ and $Z2=Z3=0$ are unrealizable over the broader bandwidths.

Figure 3:
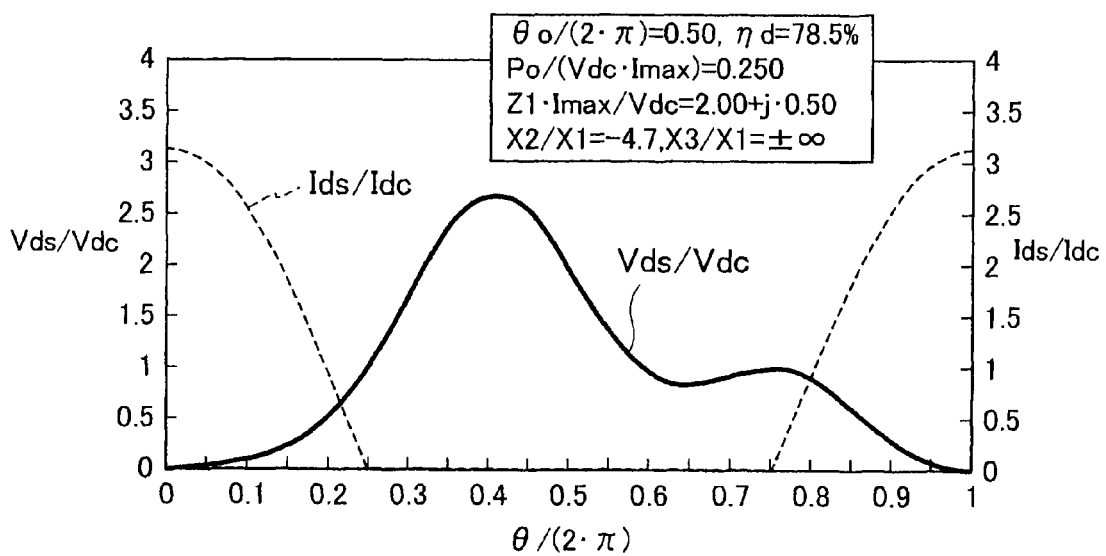
FIG. 3 is a diagram showing an example of waveforms of Vds/Vdc and Ids/Idc, in one example of a class-J3 operation according to the comparative example.
Figure 4:
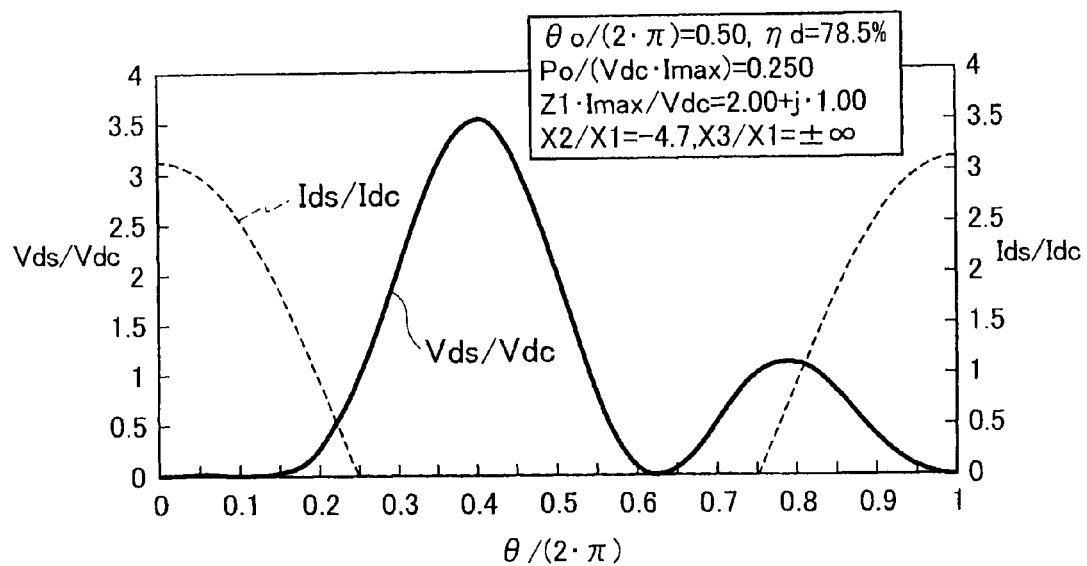
FIG. 4 is a diagram showing an example of waveforms of Vds/Vdc and Ids/Idc, in another example of the class-J3 operation according to the comparative example.

On the other hand, an example of waveforms of Vds/Vdc and Ids/Idc of one example of a class-J3 operation according to the comparative example is expressed as shown in FIG. 3, and an example of waveforms of Vds/Vdc and Ids/Idc of another example of the class-J3 operation according to the comparative example is expressed as shown in FIG. 4.

If equations $X2=-3\cdot\pi/2\cdot X1=-4.71\cdot X1$, and $X3=\pm\infty$ are satisfied even when equations $X1=0.25\cdot R1$ or $X1=0.5\cdot R1$ are realized, for example, without R1, R2 and R3 being changed for the class-B operation according to the comparative example shown in FIG. 2, neither ηd nor Po will be changed as shown in FIG. 3 or FIG. 4. Such condition is satisfied in $-0.5\cdot R1<=X1<=0.5\cdot R1$. In addition, although values of Ids of FIG. 3 and FIG. 4 are the same as that of FIG. 2, values of a fundamental wave component V1 of Vds of FIG. 3 and FIG. 4 are $1.12\angle 0.08\cdot\pi$(rad)-fold and $1.12\angle 0.15\cdot\pi$(rad)-fold as compared with V1 of FIG. 2, respectively, values of a 2nd harmonic component V2 of Vds of FIG. 3 and FIG. 4 are $0.25\angle-0.5\cdot\pi$(rad)-fold and $0.5\angle-0.5\cdot\pi$(rad)-fold as compared with V1 of FIG. 2, and values of a 3rd harmonic component V3 in FIG. 3 and FIG. 4 are $0.125\angle-0.5\pi$(rad)-fold and $0.25\angle-0.5\cdot\pi$(rad) as compared with V1 in FIG. 2, respectively.

As mentioned above, in the output side matching circuit, the relationship between variables X1 and R1 is set to $-0.5\cdot R1<=X1<=0.5\cdot R1$, variable R1 is set into $R1=2\cdot Vdc/Imax$, variable X2/X1 is set to $X2/X1=-4.71$, and variable X3/X1 is set to $X3/X1=\pm\infty$, or each of the variables is set close thereto, and thereby ηd and Po same as the class-B operation are achievable over the broader bandwidths.

However, since the class-J3 operation is the case where the conduction angle θo is equal to $\pi$(rad), the class-J3 operation is not applicable to the class-AB operation whose conduction angle θo is more than $\pi$(rad).

An class-EJ operation which aimed at improvement in efficiency of the class-J operation is also a case where the conduction angle θo is equal to $\pi$(rad).

In the class-AB operation whose conduction angle θo is more than $\pi$(rad), the load impedance of the fundamental wave, the load impedance of the 2nd harmonic, and load impedance of the 3rd harmonic are applied as a function of θo, and thereby providing a power amplifier having a high linearity and high degree of efficiency over the broader bandwidths.

The DC component of Ids is expressed by the following equation, $$Idc=Imax\cdot\{\sin(\theta o/2)-\theta o/2\cdot\cos(\theta o/2)\}/[\pi\cdot\{1-\cos(\theta o/2)\}],$$

and is expressed by $Idc=0$ at the time of $\theta o=0$, is expressed by $Idc=Imax/\pi$ at the time of $\theta o=\pi$, and is expressed by $Idc=Imax/2$ at the time of $\theta o=2\cdot\pi$.

The fundamental wave component of Ids is expressed by the following equation, $$I1=Imax\cdot\{\theta o/2-\sin(\theta o)/2\}/[\pi\cdot\{1-\cos(\theta o/2)\}],$$

and is expressed by I1=0 at the time of θo=0, is expressed by I1=Imax/2 at the time of θo=π, and is expressed by I1=Imax/2 at the time of θo=2·π.

The 2nd harmonic component of Ids is expressed by the following equation, $$I2=Imax\cdot\{\sin(\theta o/2)/2-\sin(1.5\cdot\theta o)/6\}/[\pi\cdot\{1-\cos(\theta o/2)\}],$$

and is expressed by I2=0 at the time of θo=0, is expressed by the greatest I3=0.276·Imax at the time of θo=0.667·π, is expressed by I2=0.212·Imax at the time of θo=π, and is expressed by I2=0 at the time of θo=2·π.

The 3rd harmonic component of Ids is expressed by the following equation, $$I3=Imax\cdot\{\sin(\theta o)/6-\sin(2\cdot\theta o)/12\}/[\pi\cdot\{1-\cos(\theta o/2)\}],$$

and is expressed by I3=0 at the time of θo=0, and is expressed by the greatest I3=0.185·Imax at the time of θo=0.443·π, is expressed by I3=0 at the time of θo=π, is expressed by the minimum I3=−0.047·Imax at the time of θo=1.286·π, and is expressed by I3=0 at the time of θo=2·π.

A root mean square value of Ids is expressed by the following equation, $$Irms=Imax\cdot[\theta o/2-3\cdot\cos(\theta o/2)\cdot\sin(\theta o/2)+\theta o\cdot\{\cos(\theta o/2)\}^2]^{0.5}/[(2\cdot\pi)^{0.5}19\{1-\cos(\theta o/2)\}],$$

and is expressed by Irms=0 at the time of θo=0, is expressed by Irms=Imax/2 at the time of θo=π, and is expressed by Irms=0.612·Imax at the time of θo=2·π.

Vds is expressed by the following equation, $$Vds=Vdc-[I1\cdot\{R1\cdot\cos(\theta)-X1\cdot\sin(\theta)\}+I2\cdot\{R2\cdot\cos(2\cdot\theta)-X2\cdot\sin(2\cdot\theta)\}+I3\cdot\{R3\cdot\cos(3\cdot\theta)-X3\cdot\sin(3\cdot\theta)\}],$$

and in the case of standardizing by Vdc, substituting abovementioned I1, I2 and I3, and assuming R2=R3=0, the following equation is satisfied.

$$Vds/Vdc=1-[\{\theta o/2-\sin(\theta o/2\}\cdot\{R1\cdot\cos(\theta)-X1\cdot\sin(\theta)\}-\{\sin(\theta o/2)/2-\sin(1.5\cdot\theta o)/6\}\cdot X2\cdot\sin(2\cdot\theta)-\{\sin(\theta o)/6-\sin(2\cdot\theta o)/12\}\cdot X3\cdot\sin(3\cdot\theta)]\cdot Imax/Vdc/[\pi\cdot\{1-\cos(\theta o/2)\}] \quad (1)$$

In this case, Vds/Vdc is expressed by the following equation, $$Vds/Vdc=\{1-\cos(\theta)\}\cdot\{1-\beta\cdot\sin(2\cdot\theta)\},$$

and if −1<=β<=+1 is satisfied, Vds becomes Vds=0 once or three times per cycle and changes over a range of Vds>=0.

When the above is arranged using the following formula of the trigonometric function sin(2·θ)·cos(θ)={sin(3·θ)+sin(θ)}/2, the following equation is satisfied.

$$Vds/Vdc=1-\cos(\theta)+\beta/2\cdot\sin(\theta)-\beta\cdot\sin(2\cdot\theta)+\beta/2\cdot\sin(3\cdot\theta) \quad (2)$$

If the equation (1) is compared with the equation (2), the following equations (3) to (6) are satisfied.

$$1=\{\theta o/2-\sin(\theta o)/2\}\cdot R1\cdot Imax/Vdc/[90\cdot\{1-\cos(\theta o/2)\}] \quad (3)$$

$$\beta/2=\{\theta o/2-\sin(\theta o)/2\}\cdot X1\cdot Imax/Vdc/[\pi\cdot\{1-\cos(\theta o/2)\}] \quad (4)$$

$$\beta=-\{\sin(\theta o/2)/2-\sin(1.5\cdot\theta o)/6\}\cdot X2\cdot Imax/Vdc/[\pi\cdot\{1-\cos(\theta o/2)\}] \quad (5)$$

$$\beta/2=\{\sin(\theta o)/6-\sin(2\cdot\theta o)/12\}\cdot X3\cdot Imax/Vdc/[\pi\cdot\{1-\cos(\theta o/2)\}] \quad (6)$$

The following equation is given by the equation (3).

$$R1=Vdc/Imax\cdot\pi\{1-\cos(\theta o/2)\}/\{\theta o/2-\sin(\theta o)/2\}$$

The following equation is given by the equation (3) and the equation (4).

$$-0.5\cdot R1\leq X1\leq 0.5\cdot R1$$

The following equation is given by the equation (4) and the equation (5).

$$X2/X1=-2\cdot\{\theta o-\sin(\theta o)\}/\{\sin(\theta o/2)-\sin(1.5\cdot\theta o)/3\}$$

The following equation is given by the equation (4) and the equation (6).

$$X3/X1=\{\theta o-\sin(\theta o)\}/\{\sin(\theta o)/3-\sin(2\cdot\theta o)/6\}$$

The following equations, R1=∞, X2/X1=−2, and X3/X1=1, are satisfied at the time of θo=0, the following equations, R1=2·Vdc/Imax, X2/X1=−3·π/2=−4.71, and X3/X1=±∞, are satisfied at the time of θo=π, and the following equations, R1=2·Vdc/Imax, X2/X1=−∞, and X3/X1=−∞, are satisfied at the time of θo=2·π.

On the other hand, the power consumption Pdc of DC is expressed by the following equation, $$Pdc=Vdc\cdot Idc=Vdc\cdot Imax\cdot\{\sin(\theta o/2)-\theta o/2\cdot\cos(\theta o/2)\}/[\pi\cdot\{1-\cos(\theta o/2)\}],$$

and the following equation, Pdc=0, is satisfied at the time of θo=0, the following equation, Pdc=Vdc·Imax/π, is satisfied at the time of θo=π, and the following equation, Pdc→Vdc·Imax/2, is satisfied at the time of θo=2·π.

Maximum electric output power Po of the fundamental wave is expressed by the following equation, $$Po=0.5\cdot R1\cdot I1^2=0.25\cdot Vdc\cdot Imax\cdot\{\theta o-\sin(\theta o)\}/[\pi\cdot\{1-\cos(\theta o/2)\}],$$

and the following equation, Po=0, is satisfied at the time of θo=0, the following equation, Po=Vdc·Imax/4, is satisfied at the time of θo=u, and the following equation, Po=Vdc·Imax/4, is satisfied at the time of θo=2·π.

Drain efficiency ηd is expressed by the following equation, $$\eta d=Po/Pdc=0.25\cdot\{\theta o-\sin(\theta o)\}/\{\sin(\theta o/2)-\theta o/2\cdot\cos(\theta o/2)\},$$

and the following equation, ηd=1=100%, is satisfied at the time of θo=0, the following equation, ηd=π/4=78.5%, is satisfied at the time of θo=7, and the following equation, ηd=½=50%, is satisfied at the time of θo=2·π.

In the case of on resistance Ron of FET is not 0Ω, power loss Pron by the Ron is expressed by the following equation, $$Pron=Ron\cdot Irms^2=Ron\cdot Imax^2\cdot[\theta o/2-3\cdot\cos(\theta o/2)\cdot\sin(\theta o/2)+\theta o\cdot\{\cos(\theta o/2)\}^2]/[2\cdot\pi\{1-\cos(\theta o/2)\}^2],$$

and the following equation, Pron=0, is satisfied at the time of θo=0, the following equation, Pron=Ron·Imax²/4, is satisfied at the time of θo=π, and the following equation, Pron=Ron·Imax²·⅜, is satisfied at the time of θo=2·π.

A ratio Lo of Pron to Po is expressed by the following equation, $$Lo=Pron/Po=Ron\cdot Imax/Vdc\cdot[\theta o/2-3\cdot\cos(\theta o/2)\cdot\sin(\theta o/2)+\theta o\cdot\{\cos(\theta o/2)\}^2]/[\{\theta o/2-\sin(\theta o)/2\}\cdot\{1-\cos(\theta o/2)\}],$$

and the following equation, Lo=Ron·Imax/Vdc·⅘, is satisfied at the time of θo=0, the following equation, Lo=Ron·Imax/Vdc, is satisfied at the time of θo=π, and the following equation, Lo=Ron·Imax/Vdc·3/2, is satisfied at the time of θo=2·π.

The above relation will be explained referring graphic charts hereinafter.

Figure 5:
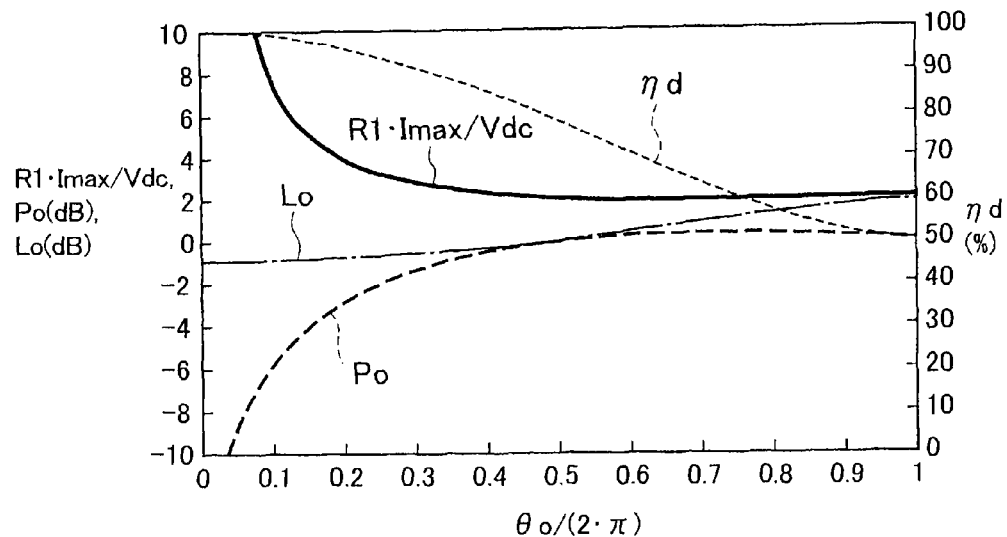
FIG. 5 is a diagram showing characteristics of each parameter $R1 \cdot Imax/Vdc$, $X2/X1$, Po, Lo, and $\eta d$ for a conduction angle $\theta o/(2 \cdot \pi)$, in the class-AB power amplifier according to the embodiment.

FIG. 5 shows characteristics of each parameter $R1 \cdot Imax/Vdc$, $X2/X1$, Po, Lo, and ηd for the conduction angle $\theta o/2 \cdot \pi$), in the class-AB power amplifier according to the embodiment.

FIG. 5 shows each parameter $R1 \cdot Imax/Vdc$, Po, Lo, and ηd at the time that the conduction angle $\theta o/(2 \cdot \pi)$ is changed from 0 to 1. If assumed as $X1=X2=X3=0$, $R1 \cdot Imax/Vdc$, Po, Lo, and rid are the same as that of the class-A operation to class-C operation, and $\theta o/(2 \cdot \pi)=1$ is corresponding to the class-A operation, $0.5<\theta o/(2 \cdot \pi)<1$ is corresponding to the class-AB operation, $\theta o/(2 \cdot \pi)=0.5$ is corresponding to the class-B operation, and $0<\theta o/(2 \cdot \pi)<0.5$ is corresponding to the class-C operation. Although ηd=78.5% is realized in $\theta o/(2 \cdot \pi)=0.5$ of the class-B operation, if assumed as $\theta o/(2 \cdot \pi)=0.6$ in the class-AB operation with more sufficient linearity than the class-B operation with poorer linearity than the class-AB operation in actuality, for example, ηd=71.0% is realized and therefore the class-AB operation is only 7.5% less efficiency as compared with the class-B operation. Moreover, $R1 \cdot Imax/Vdc=1.89$ is realized (and is 0.94-fold compared with the class-B operation) and Po is increased to 0.25 dB, and Lo=Pron/Po1=0.40 dB is realized (but little less than the class-B operation).

Figure 6:
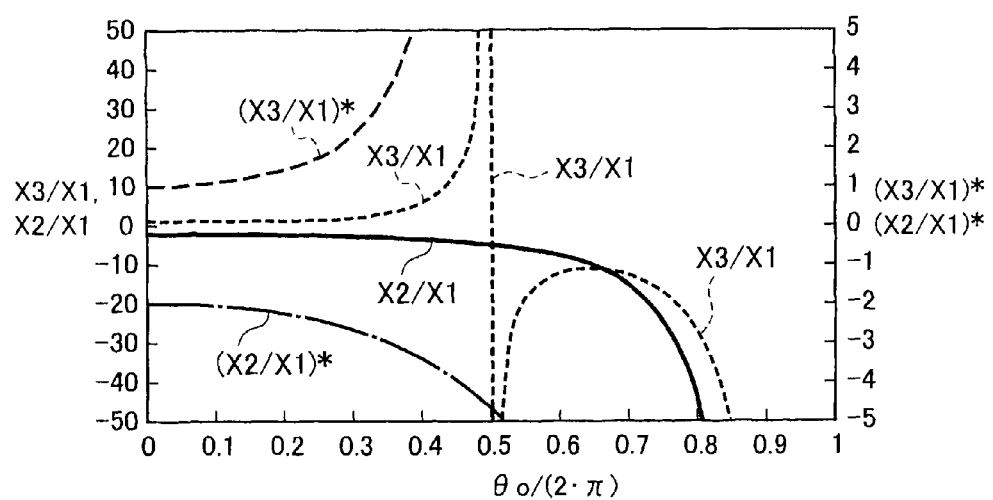
FIG. 6 is a diagram showing characteristics of $X2/X1$ and $X3/X1$, and enlarged $X2/X1$ and $X3/X1$ (indicated by $(X2/X1)^*$ and $(X3/X1)^*$) for the conduction angle $\theta o/(2 \cdot \pi)$ in the class-AB power amplifier according to the embodiment.

FIG. 6 shows characteristics of $X2/X1$ and $X3/X1$, and enlarged $X2/X1$ and $X3/X1$ (indicated by $(X2/X1)^*$ and $(X3/X1)^*$) for the conduction angle $\theta o/(2 \cdot \pi)$ in the class-AB power amplifier according to the embodiment.

FIG. 6 shows $X2/X1$ and $X3/X1$ when $\theta o/(2 \cdot \pi)$ is changed from 0 to 1, and enlarged drawings of $X2/X1$ and $X3/X1$. According to the equation $\theta o/(2 \cdot \pi)=0.5$ of the class-J3 operation, the following equations, $X2/X1=-3 \cdot \pi/2=-4.71$ and $X3/X1=\pm\infty$, are satisfied. On the other hand, according to the class-AB power amplifier according to the embodiment, the following equations, $X2/X1=-7.60$ and $X3/X1=-12.29$, are satisfied at the time of $\theta o/(2 \cdot \pi)=0.6$.

Figure 7:
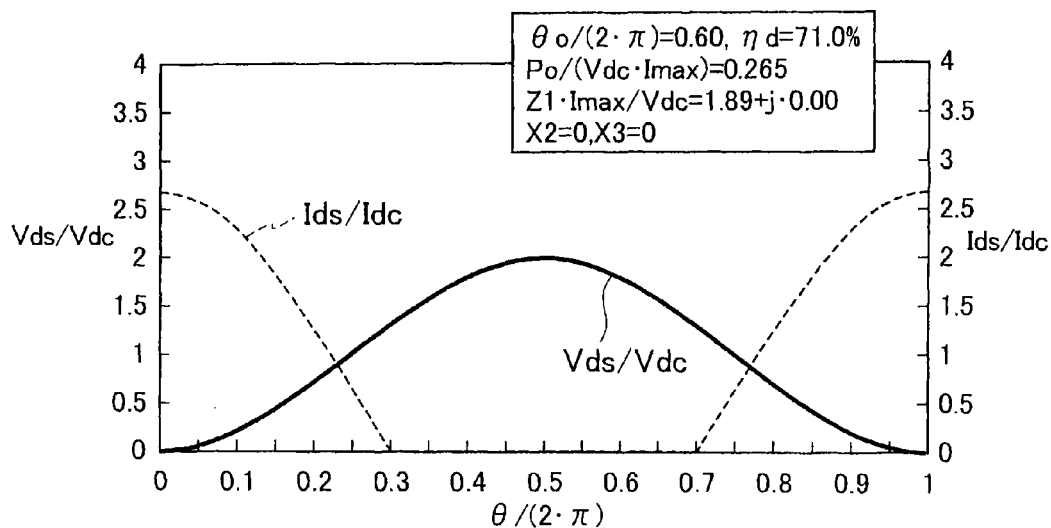
FIG. 7 is a diagram showing an example of waveforms of Vds/Vdc and Ids/Idc, in a class-AB operation according to the comparative example.

An example of waveforms of Vds/Vdc and Ids/Idc of the class-AB operation according to the comparative example is expressed as shown in FIG. 7.

In the class-AB operation (Zi=0, i=2, 3, . . . ) according to the comparative example, as clearly from Ids/Idc of $\theta o/(2 \cdot \pi)= 0.6$ shown in FIG. 7, the fundamental wave component I1 of Ids increases by 1.06-fold as compared with the class-B operation of I1 shown in FIG. 2, the 2nd harmonic component I2 decreases by 0.28-fold as compared with I1 in FIG. 2, and the 3rd harmonic component I3 increases −0.09-fold as compared with I1 in FIG. 2. As clearly from Vds/Vdc shown in FIG. 6, the fundamental wave component V1 of Vds is the same as that of V1 in FIG. 2, and Vds contains no harmonic component.

Figure 8:
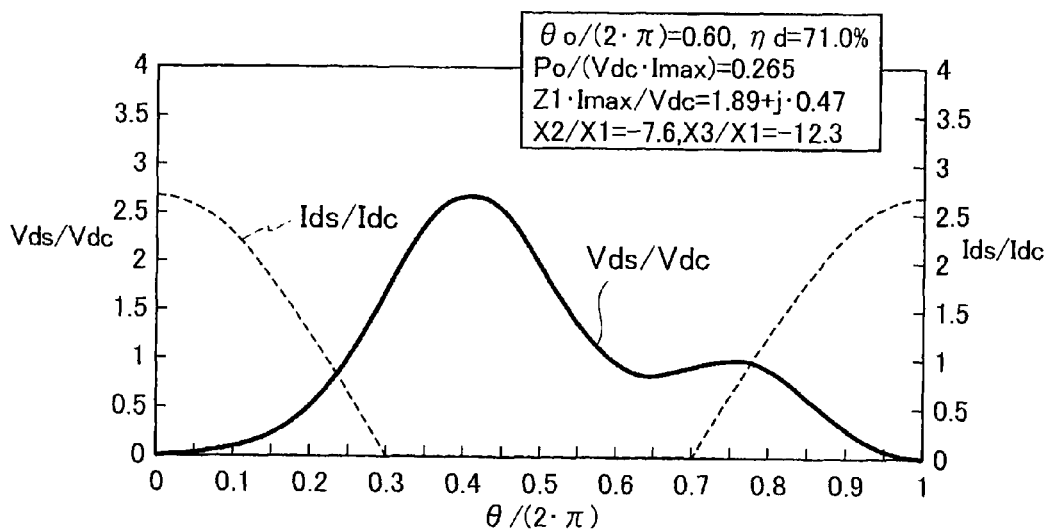
FIG. 8 is a diagram showing an example of waveforms of Vds/Vdc and Ids/Idc, in the class-AB power amplifier according to the embodiment.
Figure 9:
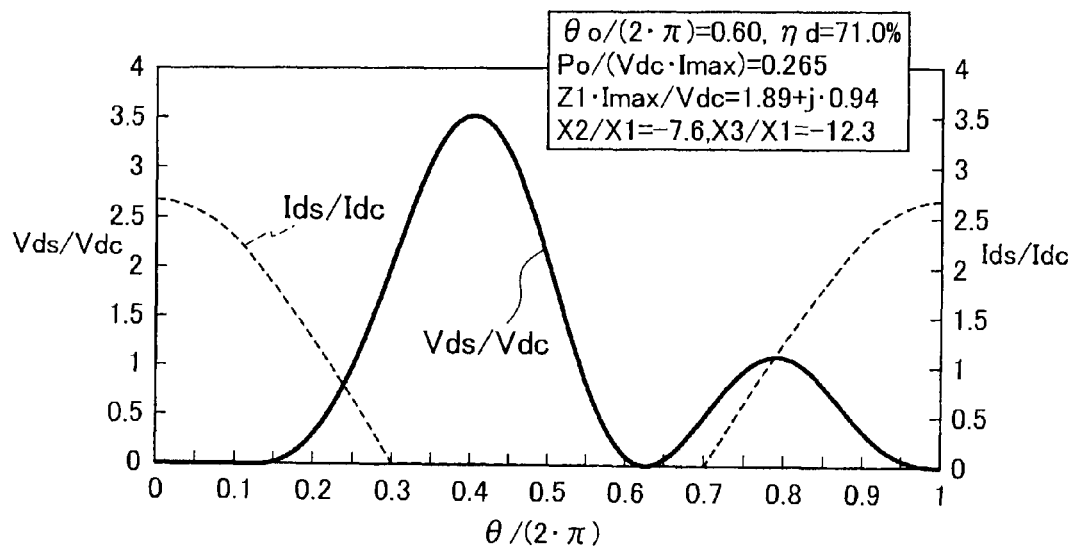
FIG. 9 is a diagram showing an example of alternative waveforms of Vds/Vdc and Ids/Idc, in the class-AB power amplifier according to the embodiment.

On the other hand, if $X2/X1=-7.60$ and $X3/X1=-12.29$ are satisfied even when equation $X1=0.25 \cdot R1$ or $X1=0.5 \cdot R1$ is realized, for example, without R1, R2 and R3 being changed, neither ηd nor Po will be changed as compared with FIG. 7, as shown in FIG. 8 or FIG. 9. In addition, although values of Ids of FIG. 8 and FIG. 9 are the same as that of FIG. 7, values of the fundamental wave component V1 of Vds of FIG. 8 and FIG. 9 are $1.12 \angle 0.08 \cdot \pi(rad)$-fold and $1.12 \angle 0.15 \cdot \pi(rad)$-fold as compared with V1 of FIG. 7, respectively, values of the 2nd harmonic component V2 of Vds of FIG. 8 and FIG. 9 are $0.25 \angle -0.5 \cdot \pi(rad)$-fold and $0.5 \angle -0.5 \cdot \pi(rad)$-fold as compared with V1 of FIG. 7, respectively, and values of the 3rd harmonic component V3 in FIG. 8 and FIG. 9 are $0.125 \angle -0.5\pi(rad)$-fold and $0.25 \angle -0.5 \cdot \pi(rad)$ as compared with V1 in FIG. 7, respectively. The above-mentioned relations are the same as that of FIG. 2 to FIG. 4.

Figure 10:
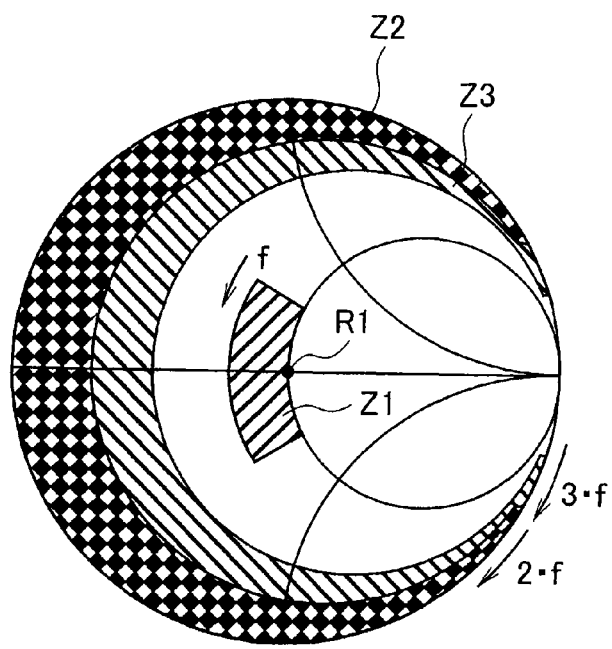
FIG. 10 is a diagram showing an example of a range of load impedances (Smith chart) of a fundamental wave f, a 2nd harmonic $2 \cdot f$, and a 3rd harmonic $3 \cdot f$, in the class-AB power amplifier according to the embodiment.

In the class-AB power amplifier according to the embodiment, an example of load impedances (Smith chart) of the fundamental wave f, the $2^{nd}$ harmonic $2 \cdot f$ and the $3^{rd}$ harmonic $3 \cdot f$ is expressed, as shown in FIG. 10.

In the actual output side matching circuit 104, although achieving R2=R3=0 is difficult over the broader bandwidths, since it can keep Po and ηd at high values as R2 and R3 are close to 0, it is applied as $R2<⅓ \cdot R1$ and $R2<⅓ \cdot R1$. FIG. 10 shows a range of load impedance (Smith chart) of the fundamental wave f, the $2^{nd}$ harmonic $2 \cdot f$, and the $3^{rd}$ harmonic $3 \cdot f$, when applied as $R2<⅙ \cdot R1$, $R3<⅓ \cdot R1$ in the case of $I2>|I3|$, for example. If $Z1=R1+j \cdot X1$, $Z2=R2+j \cdot X2$ and $Z3=R3+j \cdot X3$ in frequency band are applied into the range in FIG. 10, the output side matching circuit can be designed so that $X2/X1$ may be close to −7.60 and $X3/X1$ may be close to −12.29.

Figure 11:
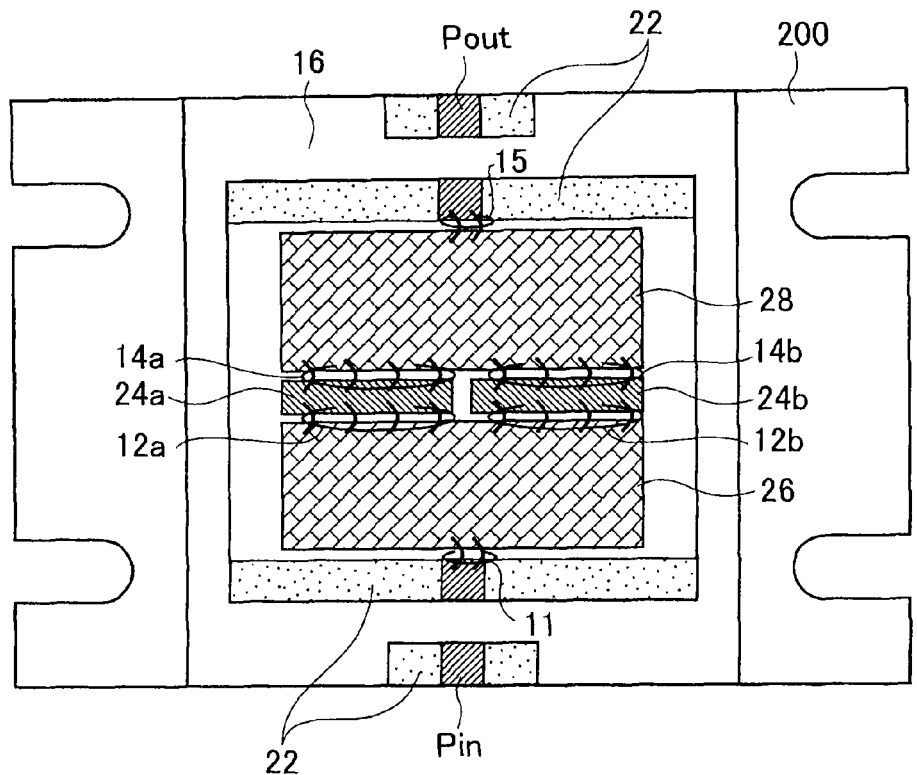
FIG. 11 is a schematic planar pattern configuration diagram showing an example of overview of an inside of housing, in the class-AB power amplifier according to the embodiment.

In the class-AB power amplifier according to the embodiment, a schematic planar pattern configuration showing an example of overview of an inside of housing is expressed as shown in FIG. 11.

As shown in FIG. 11, on the housing 200, the class-AB power amplifier according to the embodiment includes: a ceramic wall 16 configured to be disposed between an input terminal Pin and an output terminal Pout; semiconductor devices 24a and 24b configured to be disposed inside the ceramic wall 16; and an input side matching circuit substrate 26 and an output side matching circuit substrate 28 configured to be disposed to adjoin to the semiconductor devices 24a and 24b, respectively. An input side matching circuit 102 and an output side matching circuit 104 are disposed on the input side matching circuit substrate 26 and the output side matching circuit substrate 28, respectively. In this case, the input side matching circuit 102 and the output side matching circuit 104 are composed by applying a distributed transmission line electrical circuit or a lumped circuit (not shown), etc.

The bonding wire 11 connects between the input terminal Pin and the input side matching circuit substrate 26, the respective bonding wires 12a and 12b connect between the input side matching circuit substrate 26 and the respective semiconductor devices 24a and 24b, the respective bonding wires 14a and 14b connect between the output side matching circuit substrate 28 and the respective semiconductor devices 24a and 24b, and the bonding wire 15 connects between the output side matching circuit substrate 28 and the output terminal Pout. In addition, the input terminal Pin and the output terminal Pout are composed of striplines disposed on insulating layers 22.

Figure 12:
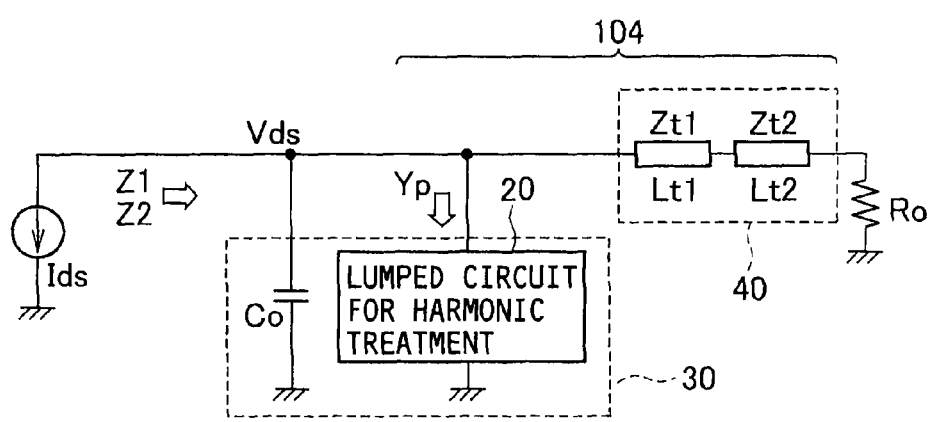
FIG. 12 is a schematic circuit configuration diagram for explaining one embodiment of an output side matching circuit, in the class-AB power amplifier according to the embodiment.

The output side matching circuit 104 may be composed of a distributed transmission line electrical circuit, or a part of the output side matching circuit 104 may be composed of a lumped circuit for harmonic treatment 20, for example, in order to be built in the housing 200 shown in FIG. 11, as shown in FIG. 12.

As shown in FIG. 12, in the class-AB power amplifier according to the embodiment, the output side matching circuit 104 includes a lumped circuit for harmonic treatment 20 and an impedance converting circuit 40. Here, although the lumped circuit for harmonic treatment 20 will be described later, the impedance converting circuit 40 is expressed by a distributed transmission line whose characteristic impedance and length are composed by two stages of Zt1 and Lt1=wavelength/4, and Zt2 and Lt2=wavelength/4.

The lumped circuit for harmonic treatment 20 not only short-circuits the 2nd harmonic of a center frequency fo, but also may achieve the broader bandwidths as a circuit for resonating in parallel with output capacitance Co in fo, for example. Then, the impedance converting circuit 40 performs impedance conversion of R1 to Ro of load. A short circuit is realized by $a\cdot\omega o$, $c\cdot\omega o$ and $e\cdot\omega o$, and an open circuit is realized by DC, $b\cdot\omega o$, $d\cdot\omega o$ and $g\cdot\omega o$, where the parallel circuit for connecting the output capacitance Co with the lumped circuit for harmonic treatment 20 in parallel is expressed as a reactance circuit 30, its admittance is expressed as Yp, the angular frequency of fo is expressed as $\omega o=2\cdot\pi\cdot fo$, $b\approx 1$, $c\approx 2$, $e\approx 3$, and $0<a<b<c<d<e<g$, and the following equation is satisfied:

$$Yp(s) = Hp \cdot \frac{s \cdot \{s^2 + (b\cdot\omega o)^2\} \cdot \{s^2 + (d\cdot\omega o)^2\} \cdot \{s^2 + (g\cdot\omega o)^2\}}{\{s^2 + (a\cdot\omega o)^2\} \cdot \{s^2 + (c\cdot\omega o)^2\} \cdot \{s^2 + (e\cdot\omega o)^2\}}$$

Figure 13:
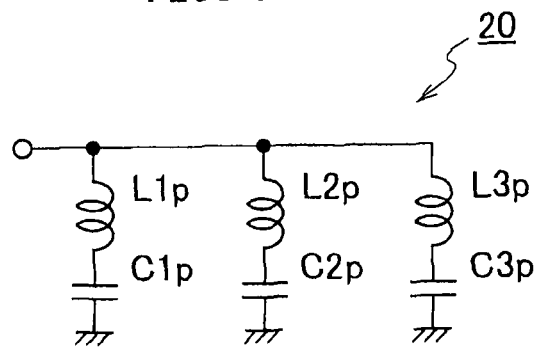
FIG. 13 is a schematic circuit configuration diagram for explaining one embodiment of a lumped circuit for harmonic treatment, in the class-AB power amplifier according to the embodiment.
Figure 14:
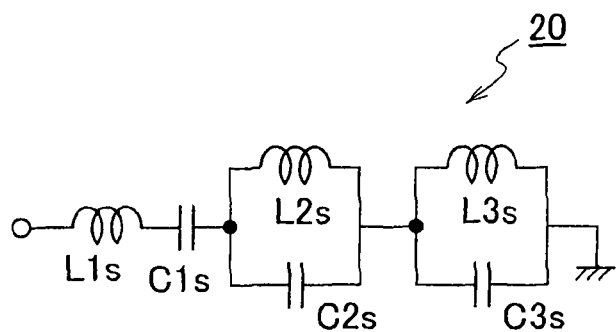
FIG. 14 is a schematic circuit configuration diagram for explaining another embodiment of the lumped circuit for harmonic treatment, in the class-AB power amplifier according to the embodiment.
Figure 15:
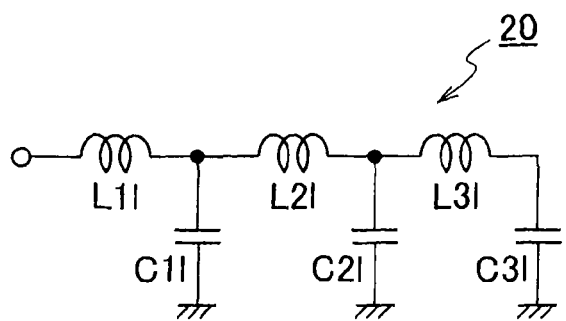
FIG. 15 is a schematic circuit configuration diagram for explaining another embodiment of the lumped circuit for harmonic treatment, in the class-AB power amplifier according to the embodiment.

The above-mentioned Yp is achievable in the following three kinds of circuits. That is, in the class-AB power amplifier according to the embodiment, schematic circuit configurations for explaining one embodiment of the lumped circuit for harmonic treatment 20 can be expressed as shown in FIG. 13 to FIG. 15.

First of all, in the following equation, $$Yp(s) = s\cdot Hp + Yp1(s)$$

which performed partial fraction expansion of Yp(s), it is applied as Hp=Co. If the partial fraction expansion of Yp1(s) is performed, the following equation is satisfied.

$$Yp1(s) = \frac{1}{s\cdot L1p + 1/(s\cdot C1p)} + \frac{1}{s\cdot L2p + 1/(s\cdot C2p)} + \frac{1}{s\cdot L3p + 1/(s\cdot C3p)}$$

$L1p = (c^2 - a^2)\cdot(e^2 - a^2)/\{Co\cdot\omega o^2\cdot(b^2 - a^2)\cdot(d^2 - a^2)\cdot(g^2 - a^2)\}$ $C1p = Co\cdot(b^2 - a^2)\cdot(d^2 - a^2)\cdot(g^2 - a^2)/\{(c^2 - a^2)\cdot(e^2 - a^2)\cdot a^2\}$ $L2p = (c^2 - a^2)\cdot(e^2 - c^2)/\{Co\cdot\omega o^2\cdot(c^2 - b^2)\cdot(d^2 - c^2)\cdot(g^2 - c^2)\}$ $C2p = Co\cdot(c^2 - b^2)\cdot(d^2 - c^2)\cdot(g^2 - c^2)/\{(c^2 - a^2)\cdot(e^2 - c^2)\cdot c^2\}$ $L3p = (e^2 - a^2)\cdot(e^2 - c^2)/\{Co\cdot\omega o^2\cdot(e^2 - b^2)\cdot(e^2 - d^2)\cdot(g^2 - e^2)\}$ $C3p = Co\cdot(e^2 - b^2)\cdot(e^2 - d^2)\cdot(g^2 - e^2)/\{(e^2 - a^2)\cdot(e^2 - c^2)\cdot e^2\}$ That is, as shown in FIG. 13, the lumped circuit for harmonic treatment 20 is composed of a parallel circuit including: a 1st series circuit composed of an inductor $L1p$ and a capacitor $C1p$; a second series circuit composed of an inductor $L2p$ and an capacitor $C2p$; and a third series circuit composed of an inductor $L3p$ and a capacitor $C3p$.

Next, if partial fraction expansion of $Zp1(s)=1/Yp1(s)$ is performed, the following equation is satisfied.

$$Zp1(s) = s\cdot L1s + \frac{1}{s\cdot C1s} + \frac{1}{s\cdot C2s + 1/(s\cdot L2s)} + \frac{1}{s\cdot C3s + 1/(s\cdot L3s)}$$

$K1 =$
$\{(b^2 - a^2)\cdot(d^2 - a^2)\cdot(g^2 - a^2)\cdot(e^2 - c^2) + (c^2 - b^2)\cdot(d^2 - c^2)\cdot(g^2 - c^2)\cdot$
$(e^2 - a^2) + (e^2 - b^2)\cdot(e^2 - d^2)\cdot(g^2 - e^2)\cdot(c^2 - a^2)\}/$
$\{(c^2 - a^2)\cdot(e^2 - a^2)\cdot(e^2 - c^2)\}$ $K2 = \{(c^2 + e^2)\cdot(b^2 - a^2)\cdot(d^2 - a^2)\cdot(g^2 - a^2)\cdot(e^2 - c^2) +$
$(a^2 + e^2)\cdot(c^2 - b^2)\cdot(d^2 - c^2)\cdot(g^2 - c^2)\cdot(e^2 - a^2) +$
$(a^2 + c^2)\cdot(e^2 - b^2)\cdot(e^2 - d^2)\cdot(g^2 - e^2)\cdot(c^2 - a^2)\}/$
$\{(b^2 - a^2)\cdot(d^2 - a^2)\cdot(g^2 - a^2)\cdot(e^2 - c^2) + (c^2 - b^2)\cdot(d^2 - c^2)\cdot$
$(g^2 - c^2)\cdot(e^2 - a^2) + (e^2 - b^2)\cdot(e^2 - d^2)\cdot(g^2 - e^2)\cdot(c^2 - a^2)\}$ -continued $K3 = \{(c\cdot e)^2\cdot(b^2 - a^2)\cdot(d^2 - a^2)\cdot(g^2 - a^2)\cdot(e^2 - c^2) +$
$(a\cdot e)^2\cdot(c^2 - b^2)\cdot(d^2 - c^2)\cdot(g^2 - c^2)\cdot(e^2 - a^2) +$
$(a\cdot c)^2\cdot(e^2 - b^2)\cdot(e^2 - d^2)\cdot(g^2 - e^2)\cdot(c^2 - a^2)\}/$
$\{(b^2 - a^2)\cdot(d^2 - a^2)\cdot(g^2 - a^2)\cdot(e^2 - c^2) + (c^2 - b^2)\cdot(d^2 - c^2)\cdot$
$(g^2 - c^2)\cdot(e^2 - a^2) + (e^2 - b^2)\cdot(e^2 - d^2)\cdot(g^2 - e^2)\cdot(c^2 - a^2)\}$ $K4 = \{K2 + (K2^2 - 4\cdot K3)^{0.5}\}/2$ $K5 = \{K2 - (K2^2 - 4\cdot K3)^{0.5}\}/2$ $L1s = 1/(Co\cdot\omega o^2\cdot K1)$ $C1s = Co\cdot K1\cdot K4\cdot K5/(a\cdot c\cdot e)^2$ $L2s = (a^2 - K4)\cdot(c^2 - K4)\cdot(e^2 - K4)/\{Co\cdot\omega o^2\cdot K1\cdot K4^2\cdot(K4 - K5)\}$ $C2s = Co\cdot K1\cdot K4\cdot(K4 - K5)/\{(a^2 - K4)\cdot(c^2 - K4)\cdot(e^2 - K4)\}$ $L3s = (a^2 - K5)\cdot(c^2 - K5)\cdot(e^2 - K5)/\{Co\cdot\omega o^2\cdot K1\cdot K5^2\cdot(K5 - K4)\}$ $C3s = Co\cdot K1\cdot K5\cdot(K5 - K4)/\{(a^2 - K5)\cdot(c^2 - K5)\cdot(e^2 - K5)\}$ That is, as shown in FIG. 14, the lumped circuit for harmonic treatment 20 is composed of a series circuit including a series circuit composed of an inductor $L1s$ and a capacitor $C1s$, a parallel circuit composed of an inductor $L2s$ and a capacitor $C2s$, and a parallel circuit composed of an inductor $L3s$ and a capacitor $C3s$.

Finally, if continued-fraction expansion of $Zp1(s)$ is performed, the following equation is satisfied.

$$Zp1(s) = s\cdot L1l + \cfrac{1}{s\cdot C1l + \cfrac{1}{s\cdot L2l + \cfrac{1}{s\cdot C2l + \cfrac{1}{s\cdot L3l + 1/(s\cdot C3l)}}}}$$

$K6 = Co\cdot\omega o^2\cdot K1$ $K7 = a^2 + c^2 + e^2 - K2$ $K8 = a^2\cdot c^2 + c^2\cdot e^2 + e^2\cdot a^2 - K3$ $K9 = K2 - K8/K7$ $K10 = K3 - a^2\cdot c^2\cdot e^2/K7$ $K11 = K8 - K7\cdot K10/K9$ $K12 = K10 - a^2\cdot c^2\cdot e^2\cdot K9/K11$ $L1l = 1/(Co\cdot\omega o^2\cdot K1)$ $C1l = Co\cdot K1/K7$ $L2l = K7/(Co\cdot\omega o^2\cdot K1\cdot K9)$ $C2l = Co\cdot K1\cdot K9/K11$ $L3l = K11/(Co\cdot\omega o^2\cdot K1\cdot K12)$ $C3l = Co\cdot K1\cdot K12/(a^2\cdot c^2\cdot e^2)$ That is, as shown in FIG. 15, the lumped circuit for harmonic treatment 20 is composed of a ladder type circuit including a series inductor L1I, a parallel capacitor C1I, a series inductor L2I, a parallel capacitor C2I, a series inductor L3I, and a parallel capacitor C3I.

Although frequency characteristics of the three kinds of the circuits are the same, when the capacitor C and the inductor L are fabricated from a low-loss chip capacitor and a bonding wire in the housing 200 shown in FIG. 11, the circuit configuration of FIG. 13 needs to apply four kinds of bonding to drain electrode pads of FETs 24a and 24b, and the circuit configuration of FIG. 14 needs to apply a chip capacitor into three stories high. On the other hand, the circuit configuration of FIG. 15 is the easiest to mount.

Figure 16:
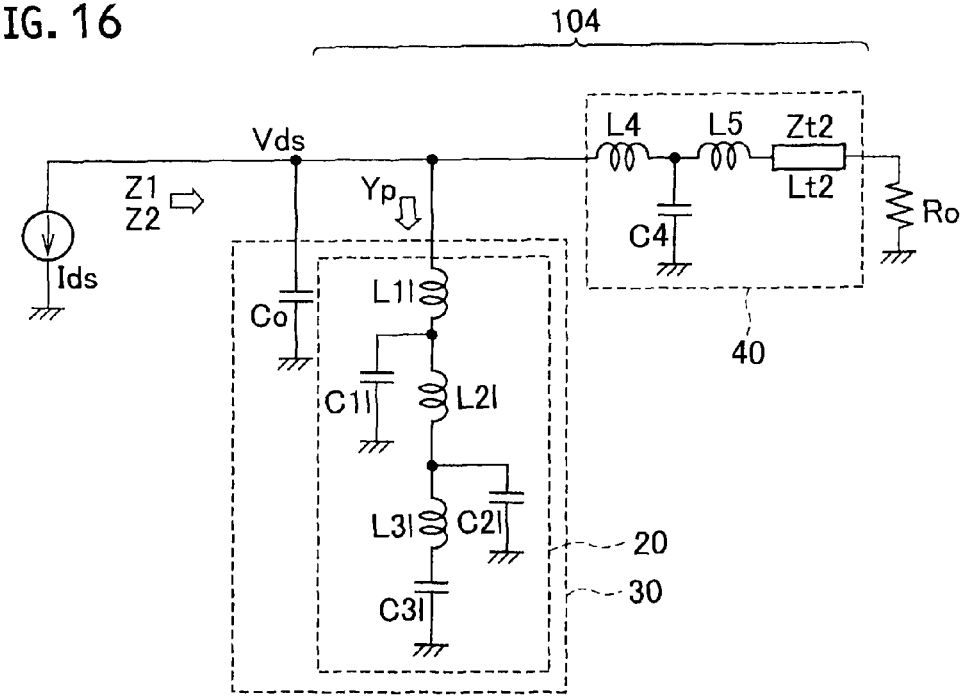
FIG. 16 is a schematic circuit configuration diagram for explaining another embodiment of the output side matching circuit, in the class-AB power amplifier according to the embodiment.

In the class-AB power amplifier according to the embodiment, a schematic circuit configuration for explaining an embodiment of the output side matching circuit 104 to which the lumped circuit for harmonic treatment 20 shown in FIG. 15 is applied is expressed as shown in FIG. 16. In FIG. 16, the lumped circuit for harmonic treatment 20 is composed of a ladder type circuit including a series inductor L1I, a parallel capacitor C1I, a series inductor L2I, a parallel capacitor C2I, a series inductor L3I, and a parallel capacitor C3I, as well as FIG. 15.

Furthermore, since the impedance of the high power FET 108 which connects a plenty of cells in parallel is low, characteristic impedance Zt1 of the distributed transmission line at the side of FET is low, and the line width of the distributed transmission line on the alumina substrate whose relative dielectric constant is about 10 becomes wider than the width of the FET chip, in the impedance converting circuit 40 in FIG. 12. On the other hand, since the substrate having a high relative dielectric constant is easy to be broken, its degree of difficulty for mounting the substrate having a large area is great. Accordingly, the distributed transmission line of Zt1 is displaced to a lumped circuit including an inductor L4, a capacitor C4 and an inductor L5, as shown in FIG. 16.

Figure 17:
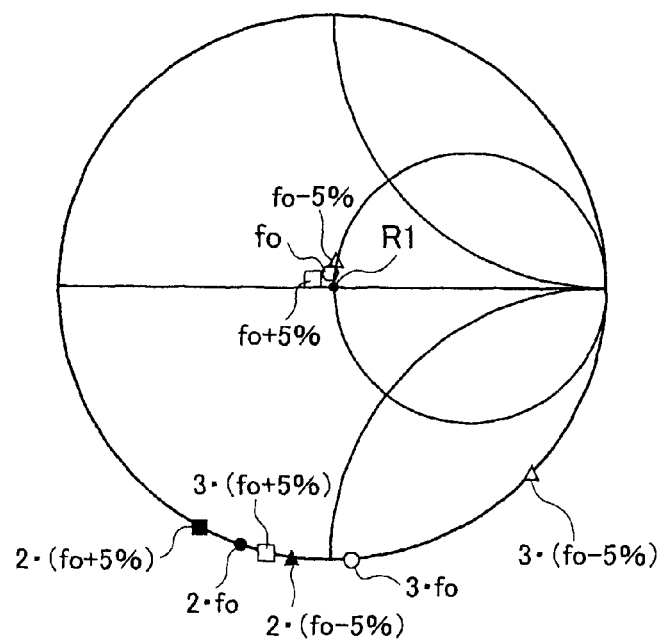
FIG. 17 is a diagram showing an example of load impedances (Smith chart) of a fundamental wave, a 2nd harmonic, and a 3rd harmonic, in the class-AB power amplifier according to the embodiment.

In the class-AB power amplifier according to the embodiment, an example of load impedances (Smith chart) of the fundamental wave, the 2nd harmonic, and the 3rd harmonic is expressed, as shown in FIG. 17.

Although characteristics are effective if frequency a·fo which is short-circuited is low, the capacitance of the capacitor C3 will become large. Therefore, for example, as shown in FIG. 17, if applied as a=0.2, and frequencies b·fo, c·fo, d·fo, e·fo, and g·fo are optimized, X2/X1=−4.15 and X3/X1=−12.7 are satisfied at fo−5%, X2/X1=−6.55 and X3/X1=−9.97 are satisfied at fo, X2/X1=−9.57 and X3/X1=−12.81 are satisfied at fo+5%, and then X2/X1=−7.60 and X3/X1=−12.29 are neared at 10% of fractional band width, at the time of b=1.05, c=2.53, d=2.76, e=6.50 and g=6.51.

Figure 18:
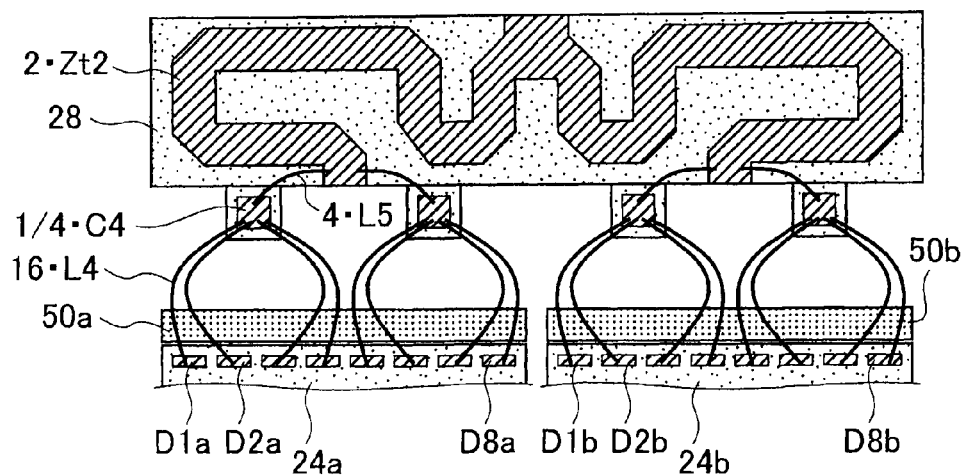
FIG. 18 is a schematic planar pattern configuration diagram showing one embodiment of an overview of the output side matching circuit, in the class-AB power amplifier according to the embodiment.

A schematic planar pattern configuration diagram showing one embodiment of an overview of the output side matching circuit 104 in the class-AB power amplifier according to the embodiment is expressed as shown in FIG. 18. Also, a schematic planar pattern configuration showing one embodiment of an overview of the lumped circuit for harmonic treatment unit 50 (50a, 50b) near the FET chip is expressed as shown in FIG. 19.

FIG. 18 shows one embodiment which performs power combining between two chips composed of the FETs 24a and 24b. In order to connect in parallel, characteristic impedance of one side of the distributed transmission line formed on the output side matching circuit substrate 28 is set to 2·Zt2 which is 2-fold as compared with Zt2.

In order to ensure uniform load impedance matching and harmonic treatment for the fundamental wave, the capacitor C4 is divide into four pieces, each the four pieces is set to ¼·C3, and then the FET chip is divided into eight cells. The drain terminal electrodes of the FET 24a and 24b are divided into eight pieces, respectively, and are expressed with D1a, D2a, . . . , D8a, D1b, D2b, . . . , D8b, respectively. Then, since each of the drain terminal electrode is parallel connection, each inductor L5 is increased by 4-fold, and each inductor L4 is increased by 16-fold. Although each the bonding wire is expressed as one piece in FIG. 18, each of the bonding wire may be increased to the required number by reviewing current capacity in actuality.

Figure 19:
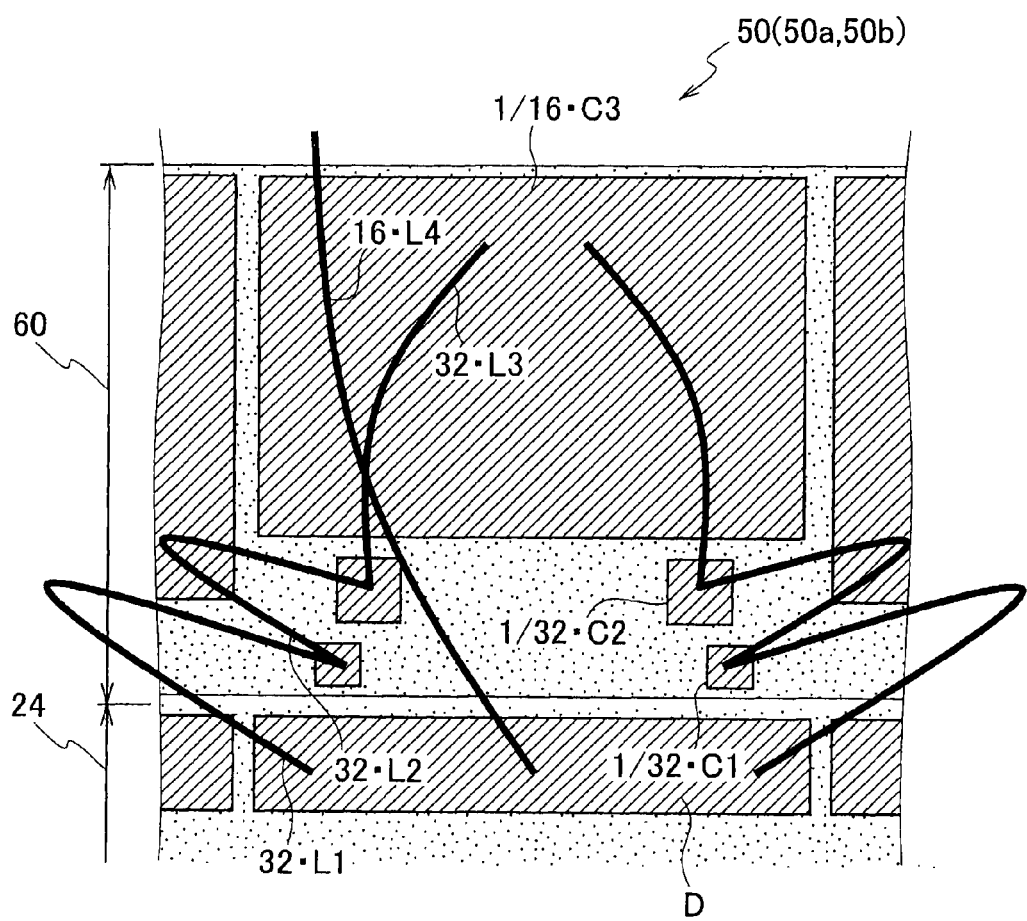
FIG. 19 is a schematic planar pattern configuration diagram showing one embodiment of an overview near an FET chip, in the class-AB power amplifier according to the embodiment.

As shown in FIG. 19, a capacitor C1, a capacitor C2, a capacitor C3, an inductor L1, an inductor L2, and an inductor L3 are disposed on the lumped circuit for harmonic treatment unit 50 (50a and 50b) omitted here. That is, in order to reduce mounting variation, the capacitor C1, the capacitor C2, and the capacitor C3 are built on the same capacitor substrate, and each of the capacitor C1 and the capacitor C2 is divided into 32 pieces and the capacitor C3 is divided into 16 pieces. Stitch bonding is used in order to reduce the number of times of bonding of the small area capacitors C1 and C2 to one time. Therefore, in order that the bonding positions between the inductor L1, the inductor L2, and the inductor L3 may be aligned in line, the bonding is performed in "reverse V"-shaped. Also, since the inductor L3 and the inductor L4 cross, bonding of the inductor L3 is formed lower than that of the inductor L4, and bonding of the inductor L4 is formed higher than that of the inductor L3.

On the other hand, in a Monolithic Microwave Integrated Circuit (MMIC) etc., since a multilayer structure is possible (and thereby a degree of flexibility in wire routing is high), and a capacitor can also be three stories high, it can achieve not only the configuration shown in FIG. 15 but also the configuration shown in FIG. 13 or FIG. 14 without any difficulty. In addition, even when parasitic inductances of VIA hole for grounding cannot be ignored, the parasitic inductance of three point of the grounding in FIG. 12 can be accommodated by design by treating with a part of the inductor L1p, the inductor L2p, or the inductor L3p. Also, the parasitic inductances of one point of the grounding in FIG. 14 can be accommodated by design by treating with a part of the inductor L1s. On the other hand, since the parasitic inductances of the grounding of the capacitor C1I or the capacitor C2I in FIG. 15 cannot be accommodated by design, a frequency characteristic becomes worse.

In addition, in MMIC etc., L and C of the lumped element may be formed as a quasi-lumped element.

As mentioned above, in the output side matching circuit 104, if the relationship between variables X1 and R1 is set to $-0.5 \cdot R1 <= X1 <= 0.5 \cdot R1$, variable R1 is set to $R1=Vdc/Imax \cdot \{1-\cos(\theta o/2)\} \cdot \pi/\{\theta o/2-\sin(\theta o)/2\}$, variable X2/X1 is set to $X2/X1=-2 \cdot \{\theta o-\sin(\theta o)\}/\{\sin(\theta o/2)-\sin(1.5 \cdot \theta o)/3\}$, and variable X3/X1 is set to $X3/X1=\{\theta o-\sin(\theta o)\}/\{\sin(\theta o)/3-\sin(2 \cdot \theta o)/6\}$, or each of the variables is set thereto so as to become equal substantially, the same linearity, the same efficiency ηd, and the same maximum electric output power Po as the class-AB operation highly efficient than the class-B operation are achievable over the broader bandwidths.

According to the embodiment, in the class-AB operation whose conduction angle θo is more than π(rad), the load impedance of the fundamental wave, the load impedance of the 2nd harmonic, and the load impedance of the 3rd harmonic are applied as a function of θo, and thereby providing the class-AB power amplifier having the high linearity and the high degree of efficiency over the broader bandwidths.

According to this embodiment, the class-AB power amplifier having the high linearity and the high degree of efficiency over the broader bandwidths can be provided.

The Other Embodiments

While a certain embodiment has been described, the embodiment has been presented by way of examples only, and is not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In addition, it needless to say that not only the FET but also a Bipolar Junction Transistor (BJT), a High Electron Mobility Transistor (HEMT), a Laterally Diffused Metal-Oxide-Semiconductor Field Effect Transistor (LDMOS), and a Heterojunction Bipolar Transistor (HBT), or a vacuum tube, etc. are applicable as an amplifying element mounted in the class-AB power amplifier according to the embodiment described herein.

Such being the case, the present invention covers a variety of embodiments, whether described or not.

What is claimed is:

1. A class-AB power amplifier comprising:
an amplifying element whose power supply voltage is expressed as Vdc and whose maximum current is expressed as Imax, a conduction angle θo of the amplifying element being less than 2·π(rad) and more than π(rad), and load impedance of a fundamental wave being expressed as Z1=R1+j·X1, load impedance of a 2nd harmonic being expressed as Z2=R2+j·X2, and load impedance of a 3rd harmonic being expressed as Z3=R3+j−X3 which are observed from a dependent current source of an equivalent circuit of the amplifying element, wherein
a relationship between variables X1 and R1 is set to −0.5·R1<=X1<=0.5·R1, variable R1 is set to R1=Vdc/Imax·{1−cos(θo/2)}·π/{θo/2−sin(θo)/2}, variable X2/X1 is set to X2/X1=−2·{θo−sin(θo)}/{sin(θo/2)−sin (1.5·θo)/3}, and variable X3/X1 is set to X3/X1={θo−sin (θo)}/{sin(θo/3−sin(2·θo)/6}, or each of the variables is set thereto so as to become equal substantially, and
R2<⅓·R1 is applied.

2. The class-AB power amplifier according to claim 1, wherein R3<⅓·R1 is applied.

3. The class-AB power amplifier according to claim 1, wherein
an output side matching circuit is connected to the amplifying element, and the output side matching circuit comprising a distributed transmission line electrical circuit.

4. The class-AB power amplifier according to claim 1, wherein
an output side matching circuit is connected to the amplifying element, and the output side matching circuit comprising a lumped circuit and a distributed transmission line electrical circuit.

5. The class-AB power amplifier according to claim 1, wherein
an output side matching circuit is connected to the amplifying element, and the output side matching circuit comprising a lumped circuit for harmonic treatment and an impedance converting circuit.

6. The class-AB power amplifier according to claim 5, wherein
the output side matching circuit comprises a reactance circuit composed of a parallel circuit of the lumped circuit for harmonic treatment and an output capacitance of the amplifying element.

7. The class-AB power amplifier according to claim 6, wherein
the lumped circuit for harmonic treatment is a parallel circuit including a first series circuit composed of a first inductor and a first capacitor, a second series circuit composed of a second inductor and a second capacitor, and a third series circuit composed of a third inductor and a third capacitor.

8. The class-AB power amplifier according to claim 6, wherein
the lumped circuit for harmonic treatment is a series circuit including a series circuit composed of a fourth inductor and a fourth capacitor, a parallel circuit composed of a fifth inductor and a fifth capacitor, and a parallel circuit composed of a sixth inductor and a sixth capacitor.

9. The class-AB power amplifier according to claim 6, wherein
the lumped circuit for harmonic treatment is a ladder type circuit composed of a seventh inductor connected in series, a seventh capacitor connected in parallel, an eighth inductor connected in series, an eighth capacitor connected in parallel, a ninth inductor connected in series, a ninth capacitor connected in parallel.

10. The class-AB power amplifier according to claim 1, wherein
the amplifying element is one selected from the group consisting of a field effect transistor, a bipolar junction transistor, a high electron mobility transistor, a hetero junction bipolar transistor, and a vacuum tube.

* * * * *